United States Patent
Camuffo et al.

(10) Patent No.: US 8,588,714 B2
(45) Date of Patent: Nov. 19, 2013

(54) METHOD AND APPARATUS FOR REGULATING A POWER AMPLIFIER

(75) Inventors: Andrea Camuffo, Munich (DE); Andreas Langer, Unterschleissheim (DE)

(73) Assignee: Intel Mobile Communications GmbH, Neubiberg (DE)

( * ) Notice: Subject to any disclaimer, the term of this patent is extended or adjusted under 35 U.S.C. 154(b) by 601 days.

(21) Appl. No.: 12/238,975

(22) Filed: Sep. 26, 2008

(65) Prior Publication Data

US 2009/0088100 A1    Apr. 2, 2009

(30) Foreign Application Priority Data

Sep. 27, 2007   (DE) .................... 10 2007 046 340

(51) Int. Cl.
    *H01Q 11/12*    (2006.01)
(52) U.S. Cl.
    USPC ................ 455/127.2; 455/114.3; 455/127.1

(58) Field of Classification Search
    USPC .................................................. 455/127.2
    See application file for complete search history.

(56) References Cited

U.S. PATENT DOCUMENTS

| | | | |
|---|---|---|---|
| 7,342,955 B2 * | 3/2008 | Forest et al. ................. | 375/219 |
| 2004/0251968 A1 * | 12/2004 | Bar-David et al. ............ | 330/297 |
| 2007/0285170 A1 * | 12/2007 | Mujtaba et al. ............... | 330/285 |
| 2008/0280575 A1 * | 11/2008 | Pesola ......................... | 455/127.1 |

* cited by examiner

*Primary Examiner* — Ajibola Akinyemi
(74) *Attorney, Agent, or Firm* — Eschweiler & Associates, LLC

(57) ABSTRACT

A method for regulating a power amplifier for operation in a timeslot data transmission system comprises providing the power amplifier with a bias for setting an operating point for the power amplifier, wherein the bias has a respective bias value. In addition, a supply voltage control signal is provided, wherein a supply voltage value is set such that a prescribed output power value of the power amplifier is attained. The bias value is changed to a new bias value. These steps are repeated until a prescribed criterion is met, but for at least one subsequent timeslot. Next the bias value of the subsequent timeslot is set to the bias value of the previous timeslot.

20 Claims, 5 Drawing Sheets

METHOD AND APPARATUS FOR REGULATING A POWER AMPLIFIER

BACKGROUND

The present disclosure relates to a method and apparatus for regulating a power amplifier for operation in a timeslot data transmission system.

A power amplifier is used particularly in a data transmission system, such as in a mobile radio system. In recent years, a series of standardized transmission systems have been defined for mobile radio systems. In this case, particularly the type of modulation of the information to be transmitted and the type of transmission between a base station and a mobile terminal are defined.

In a transmission system which is used for modulation with a constant amplitude envelope, the output power is jointly determined by the gain of the power amplifier. Modulation with a constant amplitude envelope is used in a transmission system based on the GSM (Global System for Mobile Communication) standard, for example. This has provision for the information which is to be transmitted to be put onto a carrier signal using GMSK—(Gaussian Minimum Shift Keying) Modulation.

In a communication system, it is desirable for bi-directional communication transmission to be possible. By way of example, this is achieved in some communication systems, such as, DECT (Digital Enhanced Cordless Communication), by using Time-Division Duplex (TDD). This involves the transmission being divided into a series of timeslots, with transmission taking place in one direction, for example from a mobile terminal to a base station, during one timeslot. In another timeslot, transmission takes place from the base station to a mobile terminal.

In another form, dividing up the communication into timeslots allows multiple access, so that a plurality of subscribers in the system can communicate with one another or with a jointly used transmission system. Thus, GSM has Time Division Multiple Access (TDMA) defined, in which various mobile terminals in a radio cell communicate with the base station at different times.

On account of the opportunities for time-division duplex and time-division multiple access, these methods are also used in other communication systems, such as wired or optical communication systems.

The technological development of recent decades has made it possible for the manufacturers of mobile terminals to provide ever smaller mobile terminals. Since the size of the terminals is determined by the size of a power reserve, i.e., a battery or a storage battery, among other factors, it is desirable to reduce the power consumption of the mobile terminal. In addition, lower power consumption increases the talking or operating time between charging the power reserve of the mobile terminal. Substantial power consumption in the mobile terminal is caused by the power amplifier, which provides substantial proportions of an output power for the transmission signal. It is therefore desirable to allow the most power-efficient operation of the power amplifier possible.

Secondly, it is necessary for the output power of the power amplifier to be high enough for a base station to receive a signal from the mobile terminal reliably. To this end, the base station frequently prescribes the output power at which the mobile terminal needs to send its signal.

In a mobile terminal, an output signal from the power amplifier is introduced into a radio communication channel by an antenna. The output signal is a radio-frequency signal which is at frequencies between 600 MHz and more than 2.5 GHz. As a result, impedance matching on the antenna plays an important part. If antenna impedance differs from a particular value, portions of the output signal return to the power amplifier via a connection between the power amplifier and the antenna on account of reflections on the antenna. If there is a mismatch in the antenna impedance, a transmission power radiated by the antenna is significantly lower than the output power provided by the power amplifier. This results in low energy efficiency in the power amplifier when there is a mismatch. A mismatch in the antenna impedance can arise randomly when the mobile terminal is being used. By way of example, it is sufficient for a user to touch the antenna.

Without the provision of a safety margin for setting the output power, the mobile terminal cannot behave in accordance with the guidelines of the standard under all conditions which are to be expected. A behavior which does not comply with the standard is undesirable for the network operators and is accordingly avoided by the manufacturers of the mobile terminals. Rather, increased power consumption and hence a shorter operating time for the mobile terminal are accepted.

SUMMARY

The present disclosure is based on the problem of providing a method and apparatus for regulating a power amplifier which is suitable for operation in a timeslot transmission system, in which particular power can be provided with as little energy involvement as possible. This summary is not intended to be used in determining the scope of the claimed subject matter.

A method, an apparatus, and a transmitter are disclosed for regulating a power amplifier for operation in a timeslot data transmission system. The method comprises providing the power amplifier with a bias for setting an operating point, providing a supply voltage for the power amplifier set such that a prescribed output power value of the power amplifier is attained, changing the bias value to a new bias value, and repeating the previous steps for at least one subsequent timeslot until a criterion is met, and then setting the bias value of the subsequent timeslot to the bias value of the previous timeslot.

An apparatus for regulating a power amplifier is also disclosed. The apparatus is for operation in a timeslot data transmission system, and comprises a means for storing a bias value for a timeslot, a means for providing the power amplifier with a bias for setting an operating point for the power amplifier, a means for providing a supply voltage control signal, set such that a prescribed output power value of the power amplifier is obtained, and a means for changing the bias value to a new bias value for a subsequent timeslot.

Additionally, a transmitter is disclosed, for operation in a timeslot data transmission system, comprising an apparatus as described above.

BRIEF DESCRIPTION OF THE DRAWINGS

The detailed description is set forth with reference to the accompanying figures. In the figures, the left-most digit(s) of a reference number identifies the figure in which the reference number first appears. The use of the same reference numbers in different figures indicates similar or identical items.

DETAILED DESCRIPTION

Overview

Figure 1:
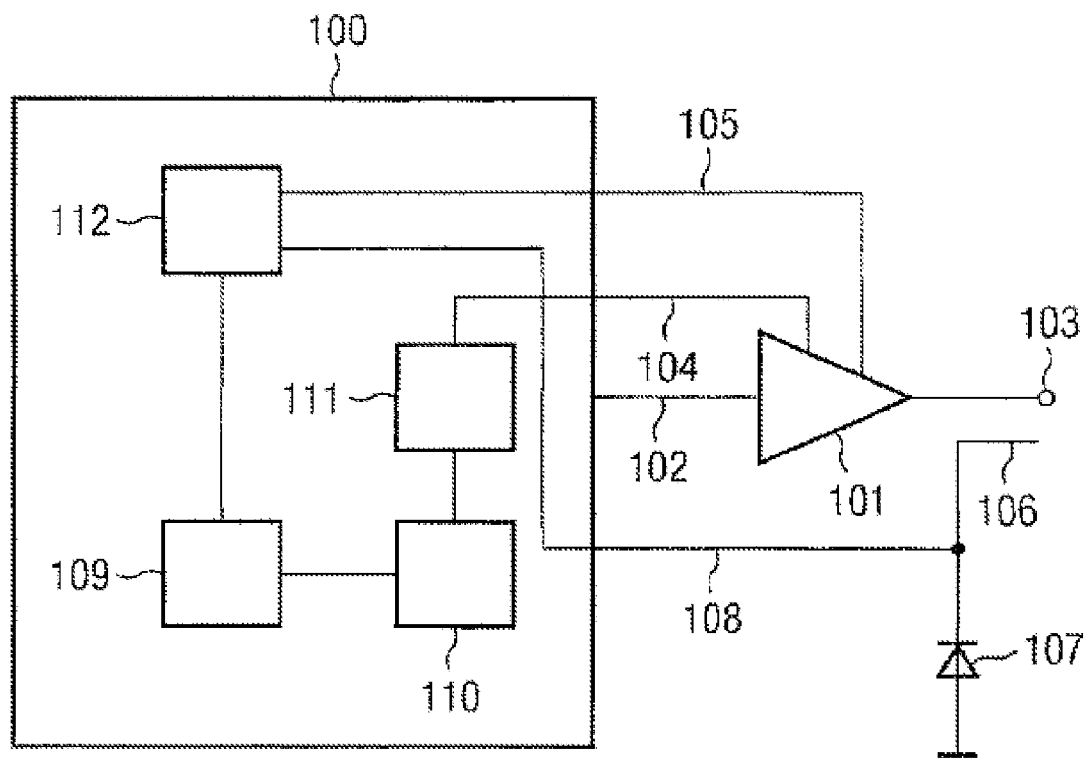
FIG. 1 shows a schematic illustration of an implementation of the apparatus according to the invention.

Different implementations of the method for regulating a power amplifier for operation in a timeslot data transmission system comprise providing the power amplifier with a bias for setting an operating point for the power amplifier, wherein the bias has a respective bias value. The bias can be kept constant for the period of a timeslot. In addition, a supply voltage control signal is provided, wherein a supply voltage value is set such that a prescribed output power value of the power amplifier is obtained. The value can be set by using a control loop. The bias value is changed to a new bias value. These steps are repeated until a prescribed criterion is met, but for at least one subsequent timeslot. Next, the bias value of the subsequent timeslot is set to the bias value of the previous timeslot.

Different implementations of the apparatus according to the invention for regulating a power amplifier for operation in a timeslot data transmission system comprise a means for storing a bias value of a timeslot. In addition, the apparatus comprises a means for providing a bias for setting an operating point for the power amplifier, wherein the bias has the bias value. A means for providing the power amplifier with a supply voltage is provided, wherein a supply voltage value is set such that a prescribed output power value of the power amplifier is attained. The apparatus likewise comprises a means for changing the bias value to a new bias value for a subsequent timeslot.

A concept of the invention involves the bias for setting the operating point for the power amplifier being set over a period of successive timeslots. This is done by virtue of a prescribed change, step-by-step from timeslot to timeslot, in the bias of the power amplifier. The bias is used to determine the saturation power of the amplifier. During each timeslot, the supply voltage control signal sets the supply voltage for the power amplifier such that a desired output power is achieved. Thus, first of all an operating point for the power amplifier is set and then the necessary output power is provided. This dynamically ascertains the operating point which corresponds to the smallest possible safety margin. The power amplifier always operates close to saturation as a switching amplifier, which means that it is set as efficiently as possible in terms of power.

The supply voltage control signal is frequently also referred to as VRAMP. The supply voltage control signal is used to control the power supply for the power amplifier. To this end, the supply voltage control signal may be supplied to a regulator, for example, which derives a supply voltage from an input supply voltage, such as a battery voltage. It would also be conceivable for the supply voltage control signal to correspond directly to a supply voltage.

Advantageous Developments

In one example of the method, the criterion is met if the ratio of a change in the supply voltage value to a change in an ascertained output power exceeds a given threshold value. When the power amplifier is approaching saturation, the change in the actually attained output power relative to the change in the supply voltage value becomes larger and larger. Hence, the dynamic matching can be terminated when the ratio of a change in the supply voltage value to a change in an ascertained output power exceeds a given threshold value.

In an alternative example of the method, the criterion is met if the supply voltage value exceeds a given threshold value. By way of example, this value can be stipulated by the point in the supply voltage at which the output power for a minimum settable bias enters saturation. Equally, the point could be chosen for an average bias or an average settable bias. It is also conceivable for the threshold value to be chosen on the basis of statistical experience.

In one example of the method, a maximum bias value is provided for a first timeslot in a series of timeslots. The effect achieved by this is that the method quickly converges upon the optimum bias value. If a high bias value is set first of all, the desired power can be achieved in all cases. The bias value is then reduced in order to lower the current draw.

In another example of the method, the supply voltage is set on the basis of a prescribed output power of the power amplifier. In this case, the output power can be prescribed in a radio system by a communicating party, for example a base station. Hence, the power amplifier can be set on the basis of existing conditions in the transmission channel.

In one implementation of the method, the supply voltage is set on the basis of an ascertained output power of the power amplifier. The power amplifier is thus set using a control loop, which is also called a closed loop.

In one implementation of the method, the bias value is changed by a reduction in the bias value by a given variable. This provides a simple method for optimizing the operating point.

In addition, in one example of the method, the bias value can also be changed by a reduction in the bias value by a variable which is constant for all timeslots.

In another example of the method, the supply voltage value is stored for the period of at least one subsequent timeslot. Accordingly, in an additional or another example, the bias value can be stored for the period of at least one subsequent timeslot.

The invention is explained in more detail below using a plurality of exemplary implementations. Although various implementations and examples are discussed here and below, further implementations and examples are possible by combining the features and elements of individual ones.

Exemplary Implementations

FIG. 1 shows a schematic illustration of an implementation of the apparatus according to the invention. The figure shows an apparatus 100 for regulating a power amplifier 101, which may be a transceiver chip or a transmitter chip in the form of an integrated semiconductor component, for example. The apparatus 100 is connected to the power amplifier 101 via a signal line 102 in order to supply the power amplifier 101 with a signal to be amplified. A signal amplified by the power amplifier 101 is provided at an output 103. In addition, the apparatus 100 is connected to the power amplifier 101 via a bias line 104. The bias line 104 is used to supply the power amplifier 101 with a bias. The bias is used to set an operating point for the power amplifier.

In addition, the apparatus 100 is connected to the power amplifier 101 via a supply voltage control line 105. The supply voltage control line 105 is used to provide the power amplifier 101 with a supply voltage control signal which regulates an output power of the power amplifier 101.

The output 103 has a power detector coupled to it which comprises a coupling element 106 and a detector diode 107. The coupling element 106 and the detector diode 107 are connected to the apparatus 100 via a detector line 108.

The apparatus has a first device 109 for providing a bias value, and this may be a digital signal processor (DSP) or an arithmetic and logic unit, for example. The first device 109 is connected to a memory 110 which stores the bias value.

In this case, the first device 109 may be set up such that it stores the bias value at the start of a timeslot and stores it in the memory 110. The memory 110 may be in the form of a volatile memory, such as a register memory, ROM store, or in the form of a non-volatile memory, such as an EEPROM or FLASH memory. The memory 110 is connected to a second device 111 for providing the supply voltage. The second device 111 provides the power amplifier 101 with the bias via the bias line 104. The second device 111 may be a digital/analog converter, for example, which converts the bias value stored in the memory 110 into an (analogue) bias. In addition, the second device 111 may also comprise an amplifier.

The apparatus 100 also has a third device 112. This third device 112 is set up to provide a supply voltage, wherein a supply voltage value is set such that a prescribed output power value of the power amplifier is attained. The third device 112 may comprise a DSP, a digital/analogue converter and an amplifier. In order to set the prescribed output power, the third device 112 is connected to the first device 109, so that the latter can be supplied with the bias value. The third device 112 is connected to the power detector via the detector line 108, so that the third device 112 can be supplied with the actual value of the output power. Accordingly, a control loop (closed loop) can be set up to set the output power.

Figure 2:
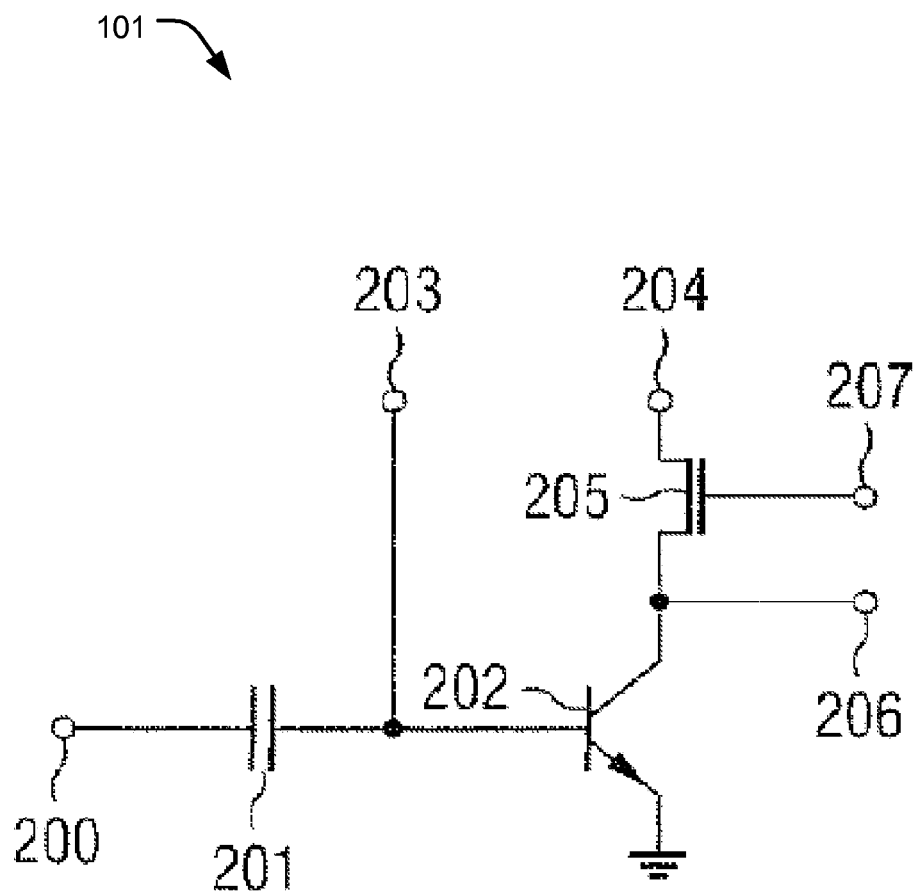
FIG. 2 shows a schematic illustration of a power amplifier for use in an implementation of the apparatus according to the present disclosure.

FIG. 2 shows a schematic illustration of a power amplifier (such as 101) for use in an implementation of the apparatus according to one implementation. The power amplifier has an input 200 which is connected to a base connection of an amplifier transistor 202 via a capacitor 201. The base connection likewise has a bias input 203 coupled to it. The power transistor 202 is connected as an emitter (or common emitter) circuit. An emitter connection of the power transistor 202 is connected to an earth connection, or to a reference potential connection. A collector connection of the power transistor 202 is coupled to a voltage input 204 via a regulator 205. The collector connection is likewise connected to a power amplifier output 206.

The power amplifier 202 amplifies a signal provided at the input 200. The capacitor 201 rejects DC voltage components of the provided signal. An operating point of the power transistor 202 is set by a bias provided at the bias input 203. The gain of the power transistor 202 is regulated by the supply voltage derived by the regulator 205. The supply voltage is derived by the regulator 205 from an input voltage, provided at the supply voltage input 204, on the basis of the supply voltage control signal.

To this end, the regulator 205 has a control input 207. The control input 207 is supplied with the supply voltage control signal. In the implementation shown, the regulator 205 is shown as a linear regulator in the form of a MOS transistor. The control input 207 corresponds to a gate connection of the MOS transistor. Note that the use of a MOS transistor in this example is not intended to be limiting, as the regulator 205 may correspond to other devices employed to perform the regulating function. In an alternate implementation, the regulator 205 may be in the form of a DC to DC converter, or the like. In the implementation shown, the supply voltage therefore corresponds to a collector voltage which is applied to the amplifier transistor 202. The voltage input 204 may be coupled to a constant voltage supply, such as a battery. The bias and the supply voltage control signal are therefore used to regulate the output power of the power amplifier 202.

Figure 3:
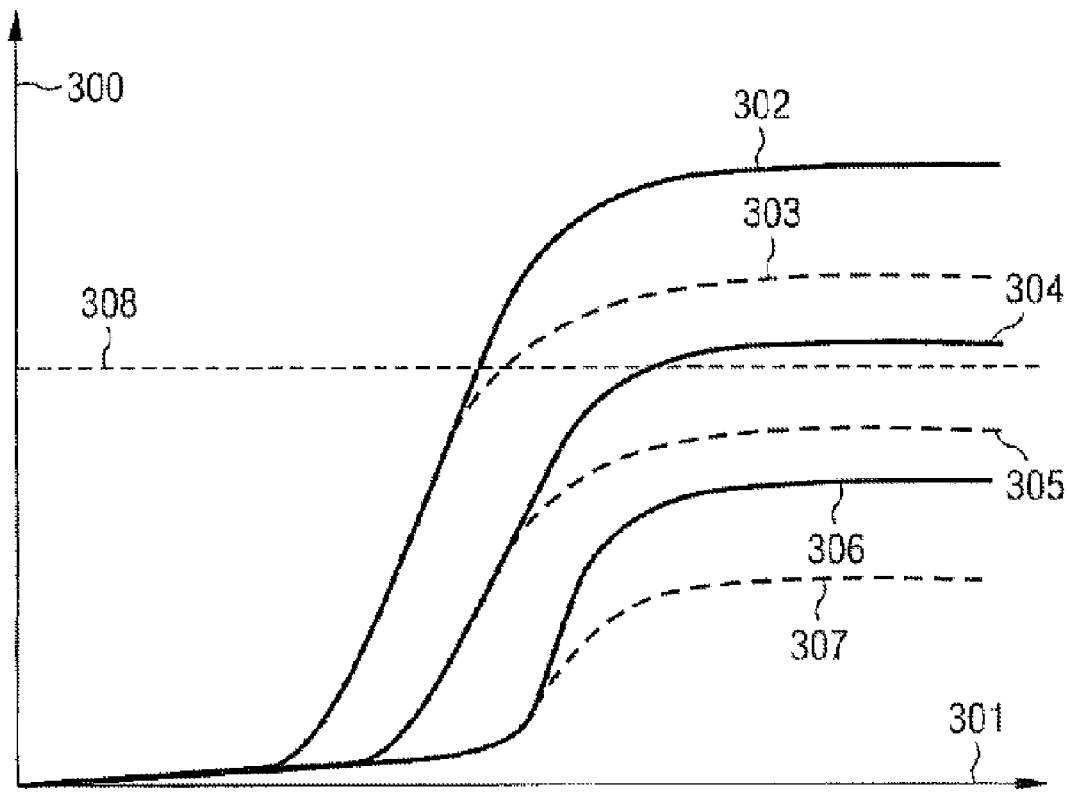
FIG. 3 shows a schematic illustration of the dependency of the output power on the supply voltage at different bias values.

FIG. 3 shows the schematic illustration of the dependency of the output power on the supply voltage at different bias values. In the illustration, the output power of a power amplifier is shown on an ordinate 300 against a supply voltage which is plotted on an abscissa 301. Overall, six different cases are shown.

A first curve 302 shows the profile of the output power over the supply voltage for a maximum bias. In this case, there is no mismatch on an antenna coupled to an output of the power amplifier. Typical antenna impedance would be 50 ohms.

A second curve 303 (shown in dashes) shows the profile of the output power likewise for a maximum bias. However, there is a mismatch in the antenna impedance. The mismatch causes the propagating wave of the output signal from the power amplifier to be reflected on the antenna impedance, and thereby causes a reduction in the radiated output power. A measure which may be indicated for the mismatch is what is known as the standing wave ratio or VSWR (Voltage Standing Wave Ratio). The standing wave ratio is calculated from the ratio of maximum to minimum voltage. The maximum voltage corresponds to the sum of the outgoing and returning voltage, and the minimum voltage is ascertained as the difference between the two. In the case shown, a VSWR of 4:1 is assumed.

A third curve 304 shows the profile of the output power for an average value of the bias. In this case, there is no mismatch on an antenna coupled to an output of the power amplifier. A fourth curve 305 (shown in dashes) shows the profile of the output power for an average bias when there is a mismatch in the antenna impedance for a VSWR of 4:1.

A fifth curve 306 shows the profile of the output power for a minimum value of the bias. In this case, there is no mismatch on an antenna coupled to an output of the power amplifier. A sixth curve 307 (shown in dashes) shows the profile of the output power for an average bias when there is a mismatch in the antenna impedance for a VSWR of 4:1.

The graph reveals that the output power of the power amplifier enters saturation at a high supply voltage. In this case, the saturation power is determined by the bias. The higher the bias, the higher the saturation power. However, the saturation power is likewise jointly determined by the VSWR. The higher the VSWR and hence the greater the mismatch, the lower the saturation power.

In an unfavorable case, a mismatch may result in the following. A particular output power 308 is required, but there is briefly a mismatch in the antenna impedance, for example, because a user happens to touch the antenna. To be able to achieve the desired output power 308, it is necessary for the bias to be chosen such that an appropriate saturation power is achieved. In the example shown, it would thus be necessary for a maximum bias to be chosen so that the power amplifier achieves the desired output power 308 by setting the supply voltage using a profile on the second curve 303. Without a mismatch, however, an average bias would suffice in order to achieve the desired output power 308 using the profile of the third curve 304. By selecting a higher bias, however, a greater loss of current is induced, which has already been described in more detail with reference to FIG. 2.

Figure 4:
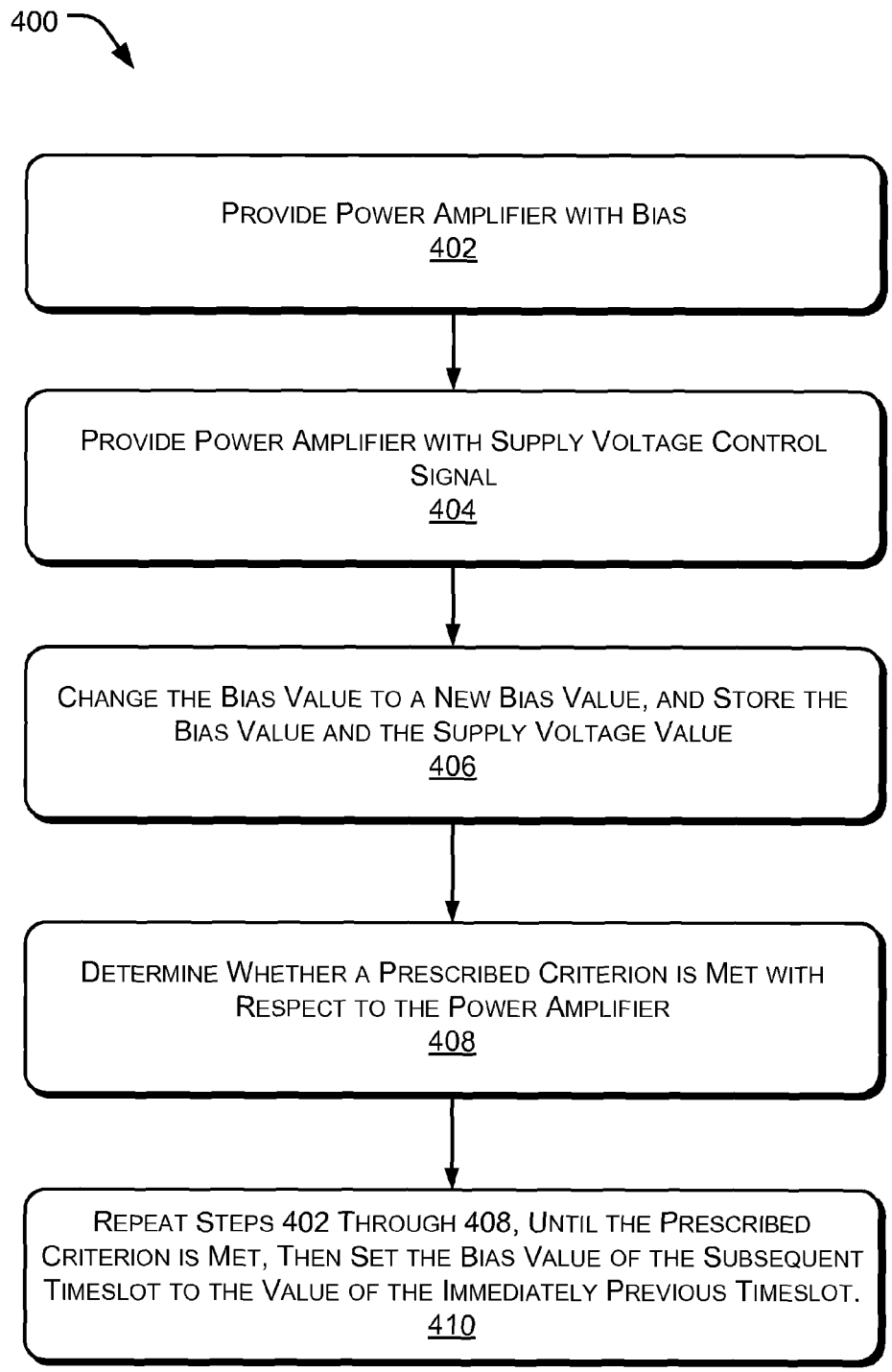
FIG. 4 shows a schematic illustration of a flowchart for an implementation of the method according to the invention.

FIG. 4 shows a schematic illustration of a flowchart for an implementation of the method 400 according to the invention. The exemplary method 400 is illustrated as a collection of blocks in a logical flow graph representing a sequence of operations that can be implemented in hardware, software, firmware, or a combination thereof. The order in which the methods are described is not intended to be construed as a limitation, and any number of the described method blocks can be combined in any order to implement the methods, or alternate methods. Additionally, individual blocks may be deleted from the methods without departing from the spirit and scope of the subject matter described herein.

In the method for regulating a power amplifier for operation in a timeslot data transmission system, the power amplifier is provided with a bias in step 402. The bias has a respective bias value. The bias is used to set an operating point for the power amplifier. Accordingly, a saturation power and hence a maximum possible output power of the power amplifier are set. At the start of the method, the bias may be set to a maximum bias value of the power amplifier. Hence, the power amplifier can be set to a maximum output power.

The output power of the power amplifier is determined by a supply voltage. To this end, in step 404, the power amplifier is provided with a supply voltage control signal. The supply voltage control signal is used to set a supply voltage value such that a prescribed output power value of the power amplifier is attained. The bias value may be determined by a prescribed output power, and it may also be determined by comparing a prescribed output power with an actual, ascertained output power.

In step 406, the bias value is changed to a new bias value. By way of example, this is done by reducing the bias value by another value, for example by deducting this value from the bias value. The reduction can be made by a variable which is constant for all timeslots, for example by an LSB before the bias value is converted into the bias by a DAC. It is also conceivable for the variable to be chosen to be larger at first so as to become smaller every timeslot. In this case, the variable may change by the same proportion, for example in each case by 100, from timeslot to timeslot, so that the variable would be logarithmically dependent on the indices of the timeslots.

When the bias value changes, the supply voltage value and the bias value can also be stored. Next, the bias value is changed to a new bias value.

In step 408, a check is performed to determine whether a prescribed criterion is met. To this end, it can be checked whether the ratio of a change in the bias value during the timeslot to a change in an ascertained output power exceeds a given threshold value. If the power amplifier approaches the saturation range when the supply voltage is regulated, the gradient of a derivation of the output power over the supply voltage becomes smaller. A detector which ascertains the output power is for its part not affected by the saturation. Accordingly, the derivation of the detector voltage over the supply voltage is also smaller. By way of example, this change can be measured by means of how many bit changes in the supply voltage value are necessary in order to change an LSB bit at an output of an ADC to which the detector voltage is supplied.

Similarly, a criterion which may be checked is whether the supply voltage value exceeds a given threshold value. The efficient operating points of the power amplifier are in a range of the supply voltage which is relatively limited. The optimum operating point is dependent on an absolute value of the supply voltage during the timeslot.

In Step 410, Steps 402 to 408 are repeated until the prescribed criterion is met. As soon as the prescribed criterion is met, the bias value of the subsequent timeslot is set to the bias value of the immediately previous timeslot. This value can be retained for all subsequent timeslots. It is possible for the method to be started again as soon as there is a new requirement for the output power.

Figure 5:
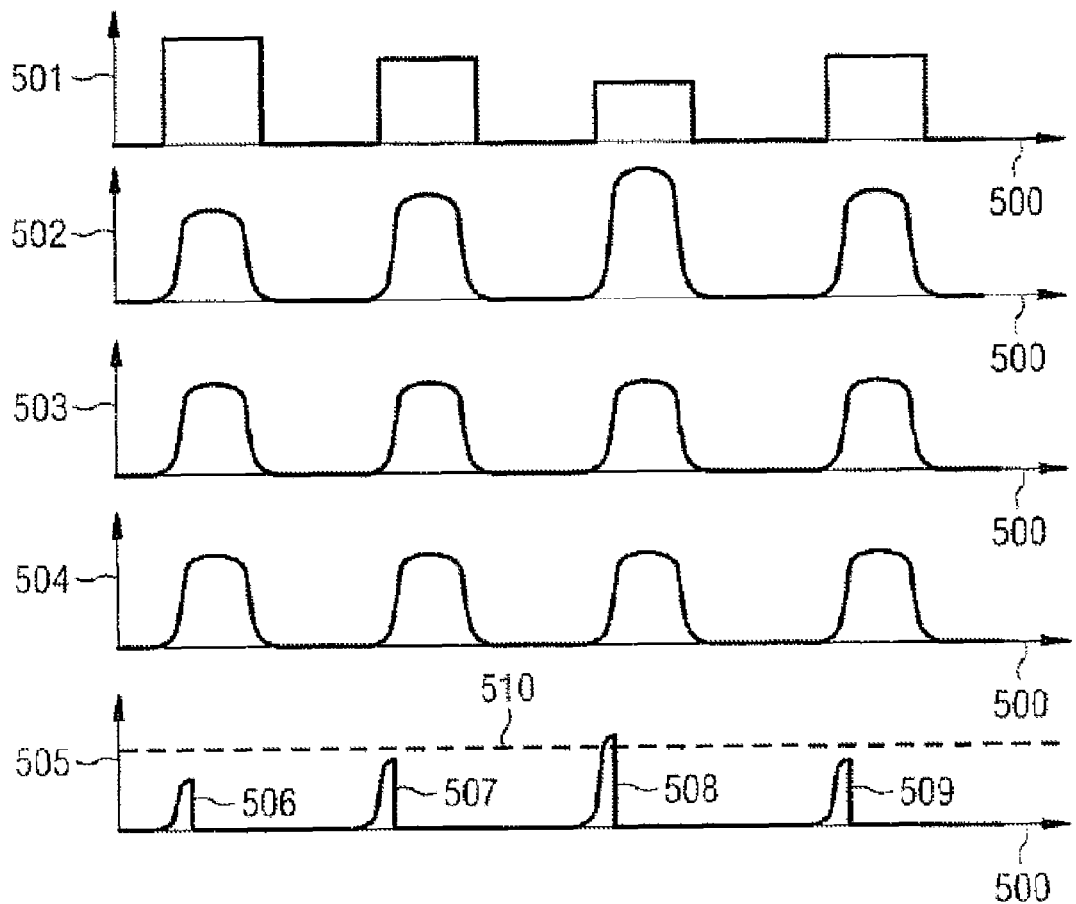
FIG. 5 shows a schematic illustration of the waveform of different variables during performance of one implementation of the method according to the invention.

FIG. 5 shows a schematic illustration of the waveform of different variables during performance of an implementation of the method according to the invention.

In this case, time is plotted on an abscissa 500. A bias for a power amplifier is plotted on a first ordinate 501. A supply voltage control signal for the power amplifier is plotted on a second ordinate 502. An output power for the power amplifier is plotted on a third ordinate 503. A detector voltage for a power detector arranged at the output of the power amplifier is plotted on a fourth ordinate 504. A ratio of a change in the supply voltage to a change in the detector voltage is plotted on a fifth ordinate 505.

FIG. 5 shows four timeslots. During a first timeslot 506, a maximum bias is set. To achieve a desired output power for the power amplifier, a supply voltage is regulated. The supply voltage control signal is relatively small, since a substantial portion of the output power is attained by means of the high bias value. Hence, the power amplifier is provided with a high safety margin. The ratio of a change in the supply voltage to a change in the detector voltage turns out to be relatively low.

During a second timeslot 507, the bias is set to be reduced by a constant value in comparison with the bias in a first timeslot 506. Accordingly, the supply voltage control signal is regulated to a higher value in comparison with the first timeslot 506 in order to attain the desired output power. The ratio of a change in the supply voltage to a change in the detector voltage is also increased in comparison with the first timeslot 506. The ratio is no higher than a threshold value 510 which is set for meeting the criterion. The safety margin turns out to be smaller than in the previous first timeslot 506.

During a third timeslot 508, the bias is also set to be reduced by a constant value in comparison with the bias in the first timeslot 506. It is likewise smaller than in the second timeslot 507. Accordingly, the supply voltage control signal is regulated to a higher value in comparison with the second timeslot 507 in order to attain the desired output power. The ratio of a change in the supply voltage to a change in the detector voltage is also increased in comparison with the second timeslot 507. In addition, the ratio is no higher than the threshold value 510 which is set for meeting the criterion. The safety margin turns out to be smaller than in the previous timeslots 506 and 507.

During a fourth timeslot 509, the bias is also reduced, and the bias assumes a higher value than in the previous timeslots. The ratio of a change in the supply voltage to a change in the detector voltage is also increased further. It is now so high that it exceeds the threshold value 510. The optimum operating point has thus been exceeded during the fourth timeslot 509. The power amplifier operates at or close to its saturation.

Accordingly, for the fourth timeslot 509, the bias is reset to the value of the bias during the second timeslot 507. The other values are accordingly set to the value of the second timeslot 507.

The power amplifier is therefore set to an optimum, i.e. energy-efficient, operating point by an iterative method. This is done during the transmission mode and observing the desired output power. In this case, the starting point is a suboptimum setting for the bias, and at first an excessive safety margin and hence unnecessary loss of current are accepted. A state in which the desired output power is not achieved and hence a system requirement is not met is avoided.

Conclusion

Although the invention has been described in language specific to structural features and/or methodological acts, it is to be understood that the invention is not necessarily limited to the specific features or acts described. Rather, the specific features and acts are disclosed as exemplary forms of implementing the invention.

What is claimed is:

1. A method for regulating a power amplifier for operation in a timeslot data transmission system, the method comprising:
providing the power amplifier with a bias for setting an operating point, wherein the bias has a respective bias value;
providing the power amplifier with a supply voltage, wherein the supply voltage is set such that a prescribed output power of the power amplifier is attained;
changing the bias value to a new bias value;
repeating the providing a bias, providing a supply voltage, and changing the bias value, for at least one subsequent timeslot, until a criterion is met; and
setting a bias value associated with the at least one subsequent timeslot to a bias value associated with an immediately previous timeslot from when the criterion is met.

2. The method according to claim 1, wherein the criterion is met if a ratio of a change in the supply voltage to a change in an ascertained output power exceeds a given threshold value.

3. The method according to claim 1, wherein the criterion is met if the supply voltage exceeds a given threshold value.

4. The method according to claim 1, wherein a maximum bias value is provided for a first timeslot in a series of timeslots.

5. The method according to claim 1, wherein the supply voltage is set on the basis of a prescribed output power of the power amplifier.

6. The method according to claim 1, wherein the supply voltage is set on the basis of an ascertained output power of the power amplifier.

7. The method according claim 1, wherein the bias value is changed by a reduction in the bias value by a given variable.

8. The method according to claim 1, wherein the bias value is changed by a reduction in the bias value by a variable which is constant for all timeslots.

9. The method according to claim 1, further comprising storing a value of the supply voltage for a period of at least one subsequent timeslot.

10. The method according to claim 1, further comprising storing the bias value for a period of at least one subsequent timeslot.

11. An apparatus for regulating a power amplifier for operation in a timeslot data transmission system, comprising:
a means for storing a bias value for a timeslot;
a means for providing the power amplifier with a bias for setting an operating point for the power amplifier, wherein the bias has a bias value;
a means for providing a supply voltage control signal, wherein a supply voltage value is set according to the supply voltage control signal such that a prescribed output power value of the power amplifier is obtained; and
a means for changing the bias value to a new bias value for a subsequent timeslot;
wherein the apparatus modifies respective bias values for one or more additional subsequent time slots and provides respective additional supply voltage control signals for the one or more additional subsequent time slots until a predetermined criterion is met for a particular additional subsequent time slot of the one or more additional subsequent time slots, the respective additional supply voltage control signals being used to set the supply voltage value, and then sets the bias value to the bias value of the immediately previous timeslot from when the predetermined criterion is met.

12. A transmitter for operation in a timeslot data transmission system, comprising the apparatus according to claim 11.

13. The transmitter according to claim 12, further comprising a power amplifier connected to the apparatus.

14. The transmitter according to claim 13, further comprising a power detector coupled to the power amplifier, the power detector configured to ascertain an output power of the power amplifier.

15. The apparatus according to claim 11, wherein the means for storing a bias value for a timeslot includes a memory.

16. The apparatus according to claim 11, wherein the means for providing the power amplifier with the bias includes a digital to analog converter or an amplifier.

17. The apparatus according to claim 11, wherein the means for providing the supply voltage control signal includes a digital signal processor, a digital to analog converter, or an amplifier.

18. The apparatus according to claim 11, further comprising a means for providing the bias value.

19. The apparatus according to claim 18, wherein the means for providing the bias value includes a digital signal processor or an arithmetic and logic unit.

20. A mobile terminal comprising:
an antenna;
a power amplifier coupled to the antenna;
an apparatus coupled to the power amplifier to regulate the power amplifier for operation in a timeslot data transmission system of the mobile terminal, the apparatus being configured to:
provide the power amplifier with a bias value;
provide the power amplifier with a supply voltage control signal;
change the bias value to a new bias value;
determine whether a prescribed criterion is met with respect to the power amplifier; and
set a bias value associated with a subsequent timeslot to a respective bias value associated with a timeslot that is immediately previous to the subsequent timeslot from when the criterion is met.

* * * * *